(12) United States Patent
Qin et al.

(10) Patent No.: US 8,895,394 B2
(45) Date of Patent: Nov. 25, 2014

(54) TRENCH FET WITH SOURCE RECESS ETCH

(75) Inventors: Ganming Qin, Chandler, AZ (US); Edouard D. de Frésart, Tempe, AZ (US); Peilin Wang, Beijing (CN); Pon S. Ku, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 220 days.

(21) Appl. No.: 13/528,375

(22) Filed: Jun. 20, 2012

(65) Prior Publication Data

US 2013/0344667 A1 Dec. 26, 2013

(51) Int. Cl.
  *H01L 21/336* (2006.01)
  *H01L 29/78* (2006.01)
  *H01L 29/66* (2006.01)

(52) U.S. Cl.
  CPC ....... *H01L 29/7813* (2013.01); *H01L 29/66734* (2013.01)
  USPC ........... 438/272; 438/270; 438/273; 257/330; 257/332; 257/333; 257/E21.419

(58) Field of Classification Search
  CPC .................. H01L 29/7813; H01L 29/66734
  USPC .......... 257/330, 332, 333, E21.419; 438/270, 438/272, 273
  See application file for complete search history.

(56) References Cited

U.S. PATENT DOCUMENTS

| | | | |
|---|---|---|---|
| 6,316,806 B1 | 11/2001 | Mo | |
| 6,489,204 B1 * | 12/2002 | Tsui | 438/270 |
| 6,583,010 B2 | 6/2003 | Mo | |
| 2006/0220133 A1 * | 10/2006 | Yeo et al. | 257/347 |
| 2006/0267088 A1 * | 11/2006 | Sharp et al. | 257/341 |
| 2008/0197409 A1 | 8/2008 | deFresart et al. | |
| 2009/0121257 A1 | 5/2009 | deFresart | |
| 2010/0181617 A1 * | 7/2010 | Lee | 257/341 |
| 2011/0024806 A1 | 2/2011 | Radic et al. | |
| 2011/0147835 A1 | 6/2011 | Radic et al. | |
| 2011/0291186 A1 * | 12/2011 | Yilmaz et al. | 257/334 |
| 2011/0291278 A1 | 12/2011 | deFresart et al. | |
| 2011/0298045 A1 * | 12/2011 | Kalnitsky et al. | 257/331 |

* cited by examiner

*Primary Examiner* — Kimberly Rizkallah
*Assistant Examiner* — Maria Ligai
(74) *Attorney, Agent, or Firm* — Terrile, Cannatti, Chambers & Holland, LLP; Michael Rocco Cannatti

(57) ABSTRACT

A high voltage vertical field effect transistor device (101) is fabricated in a substrate (102, 104) using angled implantations (116, 120) into trench sidewalls formed above recessed gate poly layers (114) to form self-aligned N+ regions (123) adjacent to the trenches and along an upper region of an elevated substrate. With a trench fill insulator layer (124) formed over the recessed gate poly layers (114), self-aligned P+ body contact regions (128) are implanted into the elevated substrate without counter-doping the self-aligned N+ regions (123), and a subsequent recess etch removes the elevated substrate, leaving self-aligned N+ source regions (135-142) and P+ body contact regions (130-134).

16 Claims, 9 Drawing Sheets

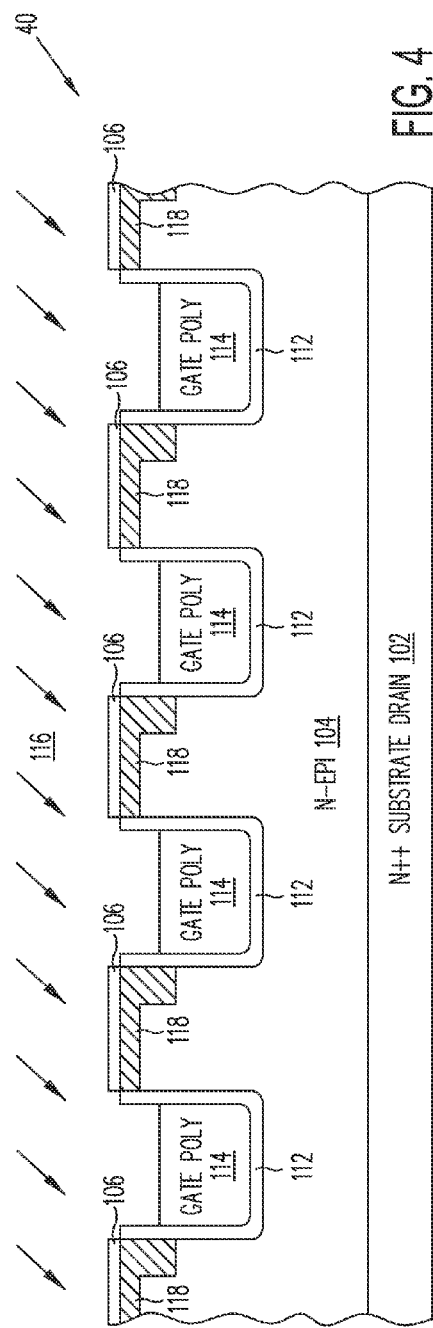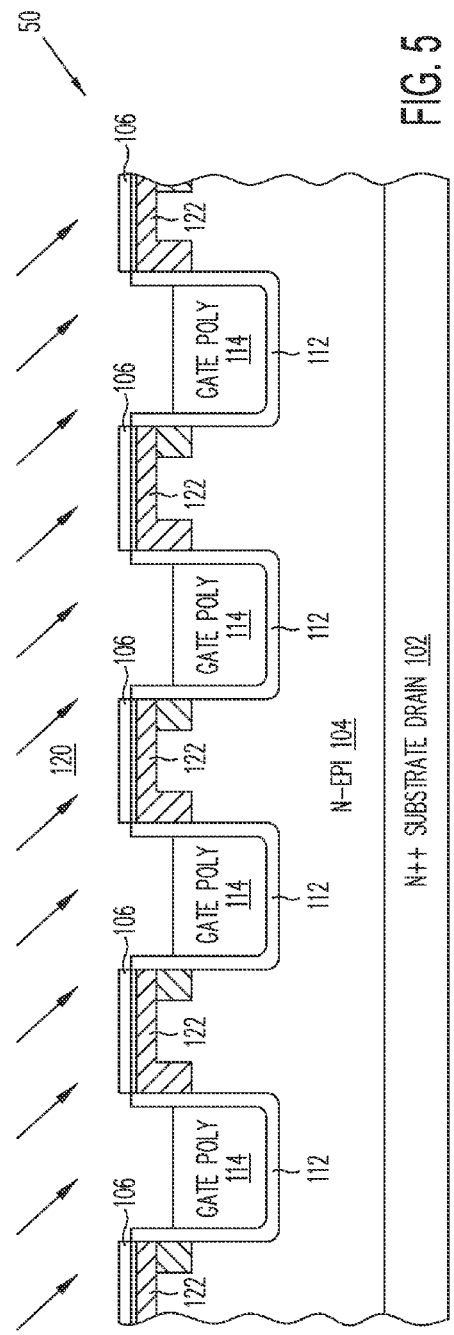

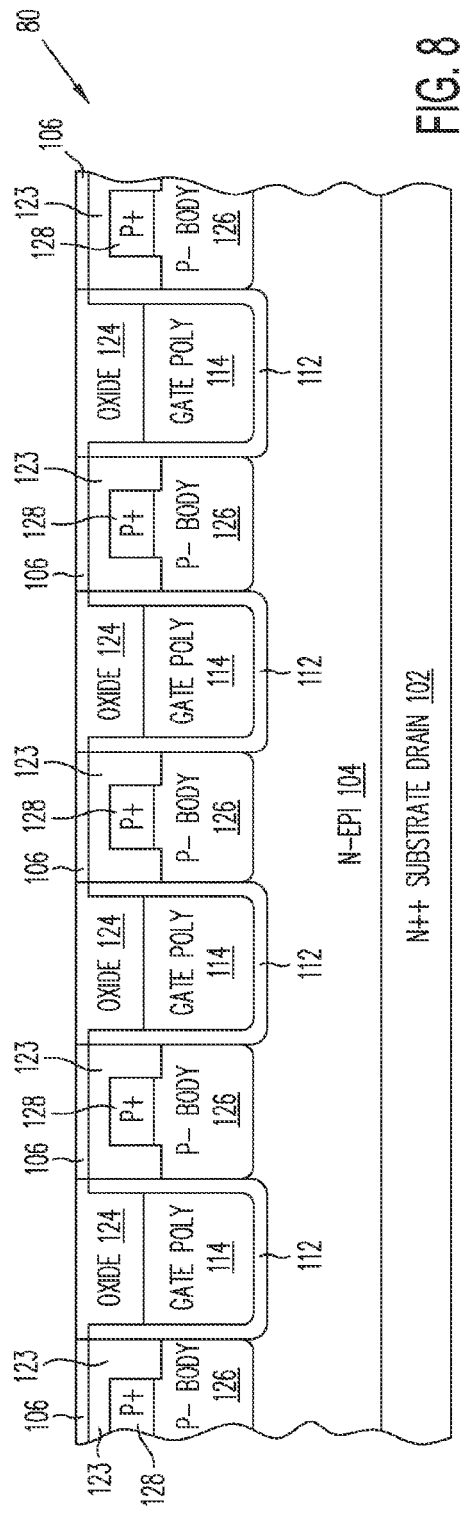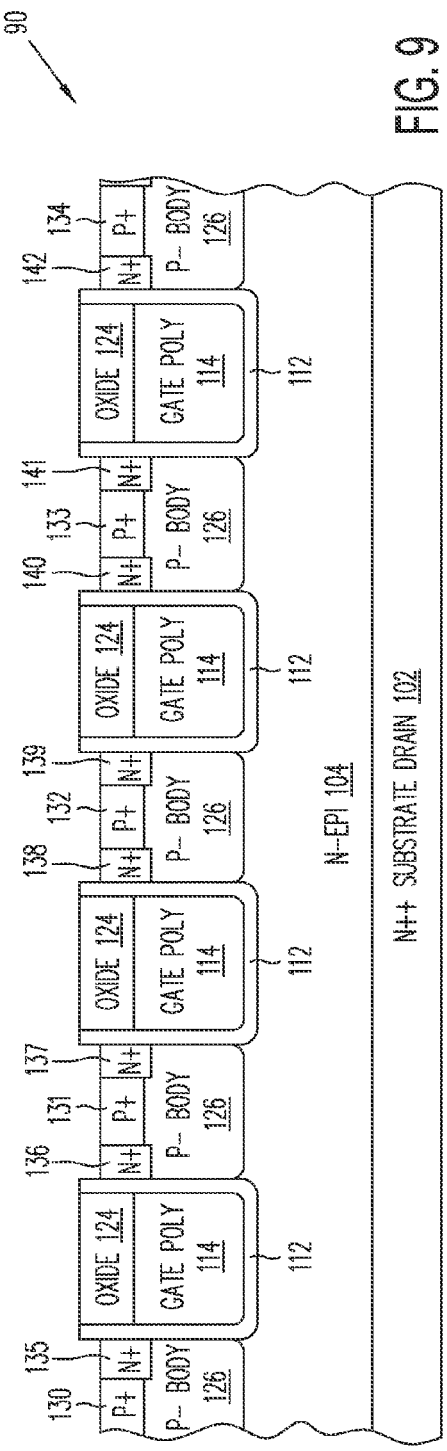

TRENCH FET WITH SOURCE RECESS ETCH

BACKGROUND OF THE INVENTION

1. Field of the Invention

The present invention is directed in general to semiconductor devices and methods for manufacturing same. In one aspect, the present invention relates to vertical field effect transistors and associated methods of fabricating and using same.

2. Description of the Related Art

Semiconductor devices used with high power applications, such as optoelectronic, high-power and high-frequency devices, operate at higher temperatures and have higher breakdown voltages than conventional transistors. To meet these operating requirements, power metal oxide semiconductor field-effect transistor (MOSFET) devices have been designed to handle significant power levels by routing the device current through the semiconductor to the back side of the substrate on which the power MOSFET is formed. Such power MOSFET devices may be stand-alone devices (such as a power device), or part of an integrated circuit (IC) formed in or on a common semiconductor or other substrate. Vertical channel field effect transistors (FETs) and vertical channel metal-oxide-semiconductor field effect transistors (MOSFETs) such as trench-FETs, trench-gate MOSFETs, U-channel MOSFETs (UMOS), V-type MOSFETs (VMOS), and T-type MOSFETS (TMOS) are non-limiting examples of devices in which the principal device current flows between an active device region near an upper device and a backside of the device. In other configurations applicable to various small signal as well as power semiconductor devices, low resistance coupling to back-side contacts, conductors and/or interconnections may be used for a variety of purposes.

BRIEF DESCRIPTION OF THE DRAWINGS

The present invention may be understood, and its numerous objects, features and advantages obtained, when the following detailed description is considered in conjunction with the following drawings, in which:

FIG. 4 illustrates processing subsequent to FIG. 3 after a first tin masked implant using a first incident angle forms self-aligned source regions into selected trench sidewalls;

FIG. 5 illustrates processing subsequent to FIG. 4 after a second unmasked implant using a second incident angle forms additional self-aligned source regions into selected trench sidewalls;

FIG. 8 illustrates processing subsequent to FIG. 7 after an additional unmasked implant forms implanted regions adjacent to the self-aligned source regions;

FIG. 9 illustrates processing subsequent to FIG. 8 after performing a source/body recess etch to leave the self-aligned source regions adjacent to the trench sidewalls;

Figure 1:
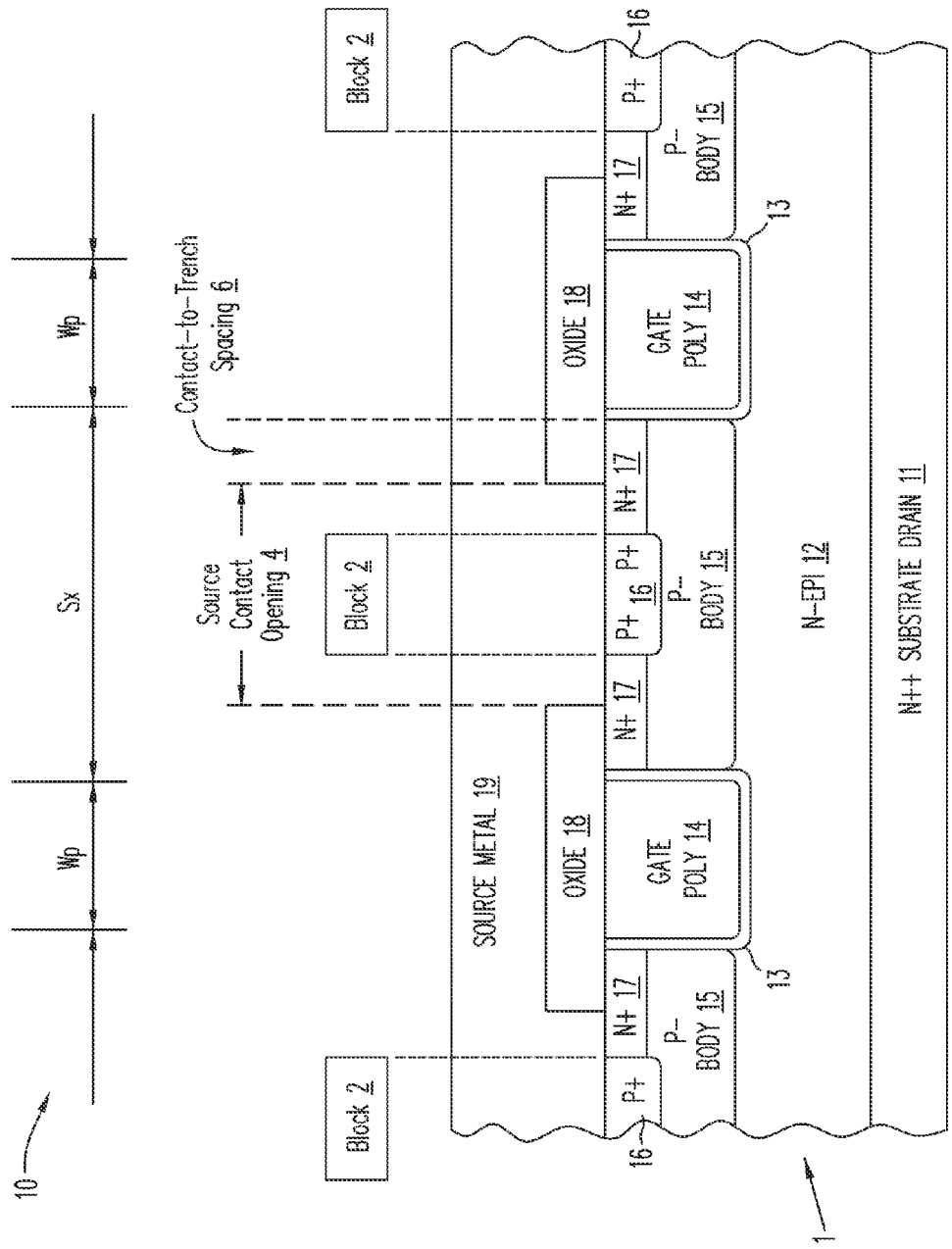
FIG. 1 is a simplified partial cross-sectional view of a trench field effect transistor formed using conventional N+ photo block and contact design rules.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A high voltage vertical field effect transistor device and associated fabrication process are described for providing high density devices with low drain-source on resistance Rds (ON) by using angled implantations into trench sidewalk formed above recessed gate poly layers, thereby forming self-aligned N+ source regions adjacent to the trenches and along an upper region of an elevated substrate. Subsequently, the recessed gate poly layers in the trenches are covered with a trench fill insulator layer, and P+ body contact regions are implanted into the elevated substrate self-aligned to the trench fill insulator layers and N+ source regions. By implanting the P+ body contact regions with a dose that is less than the N+ implant dose, the P+ body contact regions are self-aligned to the N+ source regions which are not over-doped by P+ body contact regions. Subsequently, the body contact is formed by applying a recess etch to the elevated substrate to remove the implanted N+ regions along the upper region of the elevated substrate, while retaining the N+ source adjacent to the trenches and the implanted P+ body contact regions. Using the angled implants and trench fill insulator layers to achieve self-aligned N+ source regions, the gate trench spacing limitations are reduced as compared to using conventional photoresist implant masks and contact design rules to form and delineate implanted source regions. In selected embodiments, the trench fill insulator layers formed over the recessed gate poly layers may be recessed, etched, or otherwise planarized, thereby enabling the use of flat source and body metal contact layers.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be deposited, grown, etched, masked and/or removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

As will be appreciated by those skilled in the art, shrinking device geometries can be difficult to achieve with existing semiconductor approaches and can cause conflicts between efforts to increase device density, reduce fabrication costs, and lower power consumption. For example, trench MOSFETs are often fabricated using photoresist implant masks to implant source and body contact regions on a substrate surface, but such masks can limit the achievable gate trench width and spacing when reductions in the contact opening size are limited by the photoresist minimum design rule. In addition, the minimum contact-to-trench spacing is conventionally limited by the photoresist misalignment tolerance. These limitations may be illustrated with reference to FIG. 1 which shows a simplified partial cross-sectional view of a trench field effect transistor 10 formed using conventional N+ photo block and contact design rules. As depicted, the trench FET 10 is formed as n-type power MOSFET in a bulk silicon wafer substrate 1 with gate dielectric layers 13 and gate poly regions 14 formed in a plurality of substrate trenches. In addition, N+ source regions 17 and an N++ substrate drain region 11 are formed in opposing portions of the wafer substrate 1 and separated by p-type body regions 15 (formed adjacent to the N+ source regions 17) and an n-epi drift regions 12 (formed adjacent to the p-type body region 15 and the N++ substrate drain region 11), thereby defining a source-drain current channel between the source regions 17 and drain region 11 upon application of an appropriate voltage at the gate poly regions 14. During formation, the N+ source regions 17 are implanted with an N+ photo block 2 (shown in overlay) which will have an associated minimum design rule width that limits the ability to reduce gate trench spacing and thus increase device density. The P+ body contact regions 16 may also be implanted with a P+ photo block (not shown), requiring additional resist development and removal processing. In addition, source/body contact openings 4 formed in the oxide or passivation layer 18 will have an associated minimum contact-to-trench spacing requirement 6 that may also limit the ability to reduce gate trench spacing and thus increase device density.

As will be appreciated, a variety of different fabrication processes can be used to manufacture the vertical channel MOSFET devices described herein. For example, FIGS. 2-12 are simplified cross-sectional views at different stages of manufacture which result in a high density trench MOSFETs using self-aligned implants and a source recess etch. In these figures, like reference numbers are used to identify like regions in the device. Beginning with FIG. 2, there is shown a simplified partial cross-sectional view of a semiconductor wafer structure 20 having one or more substrate layers 102, 104 formed thereon, where trench openings 110 have been formed with a dielectric layer 112 formed on the sidewalls and bottom of the trench openings 110. Specifically, a semiconductor wafer structure 20 may include a semiconductor substrate structure (not shown) which is formed of a semiconductor material which may have a predetermined crystallographic orientation. Depending on the type of transistor device being fabricated, the semiconductor substrate structure may be implemented as a bulk silicon substrate, single crystalline silicon (doped or undoped), epitaxial semiconductor material, SOI substrate, or any semiconductor material including, for example, Si, SiC, SiGe, SiGeC, Ge, GaAs, InAs, InP as well as other Group III-V compound semiconductors or any combination thereof, and may optionally be formed as the bulk handling wafer. As will be appreciated, the semiconductor substrate structure may be appropriately doped to provide n-type (electron) and p-type (hole) carriers.

On the semiconductor substrate structure, a bottom N++ doped substrate drain layer 102 is formed to a predetermined thickness (e.g., about 0.0001 to 1.5 mm, or more particularly 0.01 to 1 mm) and doping level so as to provide highly doped N++ drain region 102. For example, the drain layer 102 may be formed by slicing doped silicon ingot to a first thickness (e.g., approximately 700 um of silicon) which is then back-grinded from down to 50-254 um. The drain layer 102 may also be formed by epitaxially growing or depositing a semiconductor layer which is implanted or diffused with n-type impurities, such as by controlling the implant dopant, energy and dose so as to provide relatively shallow highly doped N+ drain region 102 by implanting arsenic with a peak concentration of approximately 1E20 $cm^{-3}$ or greater and depth of about 0.5-5 micrometers and a subsequent heat drive step, but other dopants and values may also be used. While the drain region layer 102 is shown as a bottom layer, it will be appreciated that there can be one or more additional layers below the drain region layer 102, such as a contact layer, supporting layer, and other substrate layer(s).

On the N++ doped substrate drain layer 102, an n-type epitaxial layer 104 is formed to a predetermined thickness (e.g., about 0.5-50 um) and doping level so as to provide a generally somewhat less heavily doped N type region 104. For example, the N type region 104 may be formed as an epitaxial layer so as to provide a high quality substantially single crystal semiconductor layer 104 and appropriate doping and thickness to sustain required reverse voltage bias between P+ body 126 and the n-type epitaxial layer 104. Non-limiting example of epitaxial growth include ultra-high vacuum chemical vapor deposition (UHV-CVD) at low temperature (e.g., around 550° C.), and/or low pressure chemical vapor deposition (LP-CVD) at higher temperature (e.g., around 900° C.) and by other means known in the art. Depending on the type of transistors or other active devices intended to be fabricated, the thickness of the n-type epitaxial layer 104 is controlled to provide a high quality epitaxial semiconductor material between the drain region 102 and subsequently formed trench gate electrodes that is adequate for fabrication of the desired transistors or other active devices. In these and still other embodiments, one or both of the N++ doped substrate drain layer 102 and n-type epitaxial layer 104 may be formed in several stages with or without intermediate doping steps so that the lower substrate drain layer 102 is more heavily doped than the n-type epitaxial layer 104 to reduce Rds(ON) and parasitic resistance.

On an upper surface of the n-epi layer 104, a patterned etch mask is formed by depositing or growing a first dielectric layer 106 (e.g., of pad oxide) to a predetermined thickness (e.g., about 0.1 to 10 micrometers). Subsequently, an additional masking layer 108 is deposited over the first dielectric layer 106 using an appropriate masking layer material if it is necessary. For example, a layer of silicon nitride may be deposited to a predetermined thickness (e.g., about 0.05 to 1 micrometers). On top of the nitride layer 108, an additional hardmask or patterned photoresist layer (not shown) may be formed. The etch mask layers 106, 108 are patterned to define openings over the n-epi layer 104 using any desired pattern and etch techniques, including forming a patterned layer of photoresist (not shown) to define and etch the hardmask layers 106, 108 to serve as a mask for a hardmask etch process which etches down into the substrate n-epi layer 104 by removing exposed portions of the hardmask layers 106, 108. After the hardmask etch process, the photoresist is stripped (e.g., with an ash/piranha process), leaving the patterned etch mask 106, 108 in place, and a substrate etch process is applied to form trench openings 110 in the substrate n-epi layer 104. Any desired anisotropic etch technique may be used to form the trench openings 110, including a dry etching process such as reactive-ion etching, ion beam etching, plasma etching or laser etching, a wet etching process wherein a chemical etchant is employed or any combination thereof. In an example embodiment, one or more trench etches are performed with the patterned mask layers 106, 108 and photoresist (not shown), or any combination to etch into the substrate n-epi layer 104 to form a shallow trench openings 110 in which the gate electrodes for the trench MOSFET will be formed. The anisotropic etch conditions and dimensions of the openings in the etch mask layers 106, 108 are controlled to form trench openings 110 with predetermined trench depths, trench widths, and intra-trench spacing. For many devices, the trench widths may be in the range of about 0.05 to 20 micrometers, more conveniently in the range of about 0.05 to 5 micrometers and preferably about 0.1 to 1 micrometers, but wider and narrower cavities can also be formed. In addition, the trench depth may be in the range of about 0.1 to 10 micrometers, more conveniently in the range of about 0.3 to 5 micrometers and preferably about 0.5 to 2 micrometers, but deeper or shallower cavities can also be formed. The intra-trench spacing (e.g., lateral spacing between the centers of adjacent trenches) may be in the range of about 0.2-20 micrometers, more conveniently in the range of about 0.2-5 micrometers and preferably about 0.5-2 micrometers, but wider or tighter spacings may be used.

On the sidewalls and bottom of the trench openings 110, gate dielectric layers 112 are formed to a predetermined thickness (e.g., 100-1500 Angstroms). In selected embodiments, the gate dielectric layer 112 is formed by a thermal oxidation process which grows a layer of silicon dioxide from the substrate n-epi layer 104 on the exposed bottom and sidewall surfaces of the trench openings 110, though a deposition process may also be used to form the gate dielectric layer 112. The thickness of the gate dielectric layer 112 may be controlled to be within the range of about 0.1 to 1000 nanometers, more conveniently in the range of about 1 to 500 nanometers and preferably about 10 to 150 nanometers, but thicker and thinner layers can also be formed.

Figure 2:
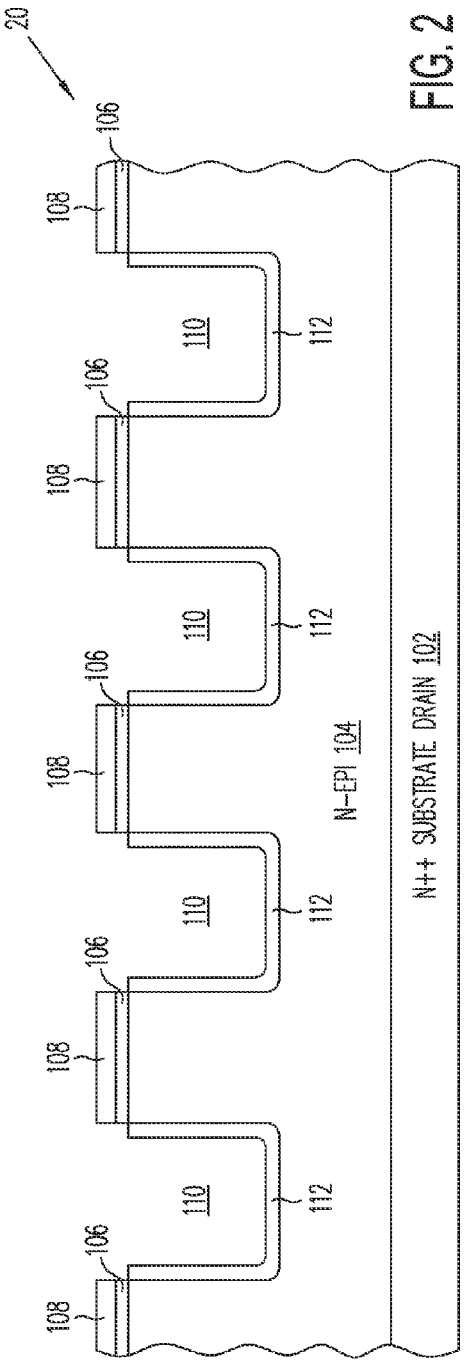
FIG. 2 is a simplified partial cross-sectional view of a semiconductor wafer structure having a substrate in which trench openings have been formed with a dielectric layer formed on the sidewalls and bottom of the trench openings.
Figure 3:
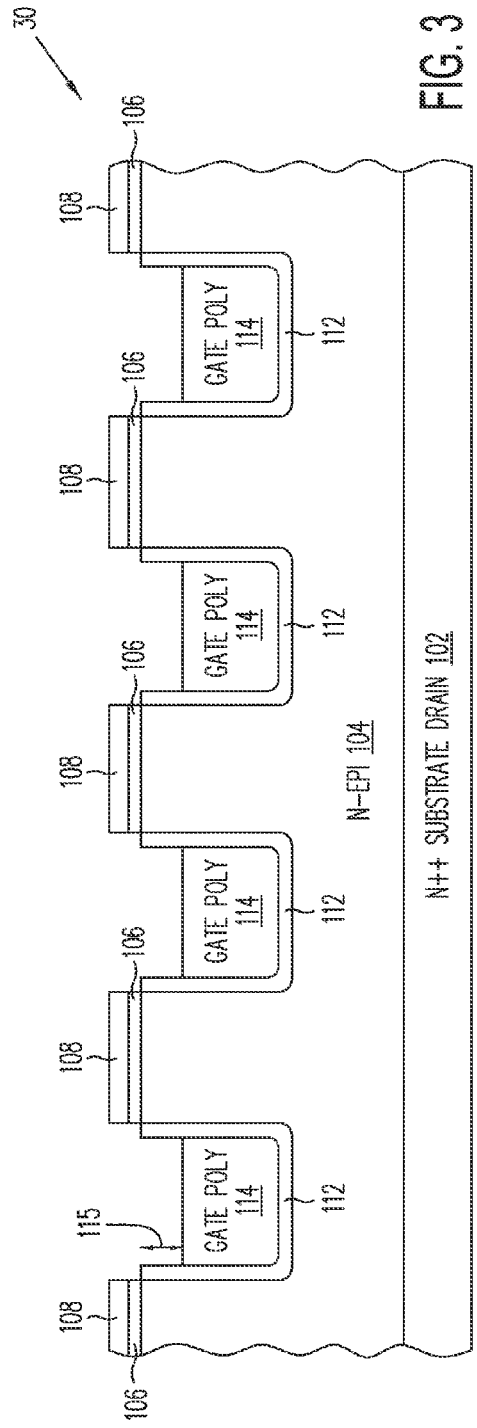
FIG. 3 illustrates processing subsequent to FIG. 2 after recessed gate poly has been formed in the trench openings.

FIG. 3 illustrates processing of the semiconductor wafer structure 30 subsequent to FIG. 2 after recessed conductive gate structures 114 are formed in the trench openings 110. In selected embodiments, the conductive gate structures 114 may be formed by sequentially depositing or forming one or more conductive layers over the gate dielectric layer 112 using any desired deposition or sputtering process, such as chemical vapor deposition (CVD), plasma-enhanced chemical vapor deposition (PECVD), physical vapor deposition (PVD), atomic layer deposition (ALD), molecular beam deposition (MBD) or any combinations) thereof. For example, a conformal layer of polysilicon may be blanket deposited over the semiconductor wafer structure 30 to fill at least the bottom of the trench openings 110, if not entirely fill the trench openings 110. As deposited, the polysilicon layer may be formed as an undoped or lightly doped layer having relatively low conductivity or current flow, in which case the conductivity in the polysilicon layer is established with one or more subsequent doping or implantation steps. However, it will be appreciated, that the polysilicon layer may be formed as a heavily doped layer having relatively high conductivity. In addition, the polysilicon layer can be initially deposited in an amorphous or polycrystalline state, but it will be in a polycrystalline state after subsequent annealing steps in the device integration. The material(s) for the polysilicon layer can be silicon, silicon-germanium, or other suitable semiconductors.

Once deposited, the polysilicon layer may then etched, recessed, or polished until the recessed gate poly structures 114 are formed in the trench openings 110. For example, a conformally deposited polysilicon layer may be etched back using a timed RTF etch or by applying a chemical mechanical polish (CMP) step, alone or in combination with additional etching, stripping and/or cleaning processes. In this way, the top of each gate poly structure 114 is recessed below the top of the substrate n-epi layer 104 forming the elevated substrate by a predetermined minimum recess distance 115 which is controlled so that, the top of the recessed gate poly structure 114 is above the bottom of the subsequently formed N+ source regions 118, 122 as described more fully below.

FIG. 4 illustrates processing of the semiconductor wafer structure 40 subsequent to FIG. 3 after a first unmasked implant 116 using a first incident angle forms self-aligned source regions 118 into selected trench sidewalk. Prior to performing the first angled implantation, the patterned nitride layer 108 may be removed or stripped with an appropriate etch chemistry to leave the remnant patterned dielectric layer 106 and gate dielectric layer 112. The self-aligned source regions 118 may be formed by implanting an appropriate dopant species at a predetermined energy, dose, and implant angle into the elevated substrate and selected trench sidewalls of the substrate n-epi layer 104. For example, by implanting arsenic with a peak concentration of approximately 1E20 $cm^{-3}$ or greater to a depth of about 1000-5000 Angstroms, self-aligned source regions 118 are formed which each include an elevated surface region and a trench sidewall implant region. The ion implantation beam 116 impinges on the substrate n-epi layer 104 at a depicted first incident angle of about 45 degrees, though other implant angles (e.g., about 30 degrees from the surface of the substrate n-epi layer 104) may be used. With the first incident angle, dopant species are implanted into the upper elevated surface of the substrate n-epi layer 104 and the "left" sidewalls of the trenches 110 in substantially similar amounts to obtain similar doping concentrations, though the depth and concentration of the dopants on the sidewall relative to the elevated surface may be varied as desired by the angle of implantation, according to trigonometric and crystallographic principles. With the angled implant, some of the dopant is implanted into the trench sidewall below the top of the recessed gate poly structure 114, so that an overlap of the gate and source regions will be formed. Though not shown, the self-aligned source regions 118 may have a slight taper at the trench sidewall implant regions due to the masking effect of the upper corner of the recessed gate poly structure 114. Also, it will be appreciated, the relatively thin patterned dielectric layer 106 and gate dielectric layer 112 will have very little effect on the implantation depth of the self-aligned source regions 118.

FIG. 5 illustrates processing of the semiconductor wafer structure 50 subsequent to FIG. 4 after a second unmasked implant 120 using a second incident angle forms additional self-aligned source regions 122 into selected trench sidewalls. In the example shown, the self-aligned source regions 122 may be formed by implanting an appropriate dopant species 120 with the same implant energy and dose as the first unmasked implant 116, but at a complementary implant angle, self-aligned source regions 122 are formed which each include an elevated surface region and a trench sidewall implant region. The ion implantation beam 120 impinges on the substrate n-epi layer 104 at a depicted second incident angle of about −45 degrees, though other implant angles (e.g., about −30 degrees from the surface of the substrate n-epi layer 104) may be used. With the second incident angle being complementary to the first incident angle of the first source implant, the opposite trench sidewall implant regions that were not implanted in the first implant 116 will now be implanted to form implanted source regions in the upper elevated surface of the substrate n-epi layer 104 and the "right" sidewalk of the trenches 110 in substantially similar amounts to obtain similar doping concentrations. Of course, the depth and concentration of the dopants on the sidewall relative to the elevated surface may be varied as desired. And the angled implant also forms an overlap of the gate and source regions on the "right" trench sidewalk which may have a slight taper (not shown) due to the masking effect of the upper corner of the recessed gate poly structure 114, As shown in the subsequent figures, the implanted N+ regions 118, 122 together form combined N+ regions 123 which each include surface implant region (along the top surface of the elevated substrate n-epi layer 104) and self-aligned sidewall regions adjacent to the recessed conductive gate electrode structure. Also, the top of the recessed gate poly structure 114 should be located above the bottom of the trench sidewall implanted N+ regions 123, and may even be located above the top of the implanted N+ regions 123.

Figure 6:
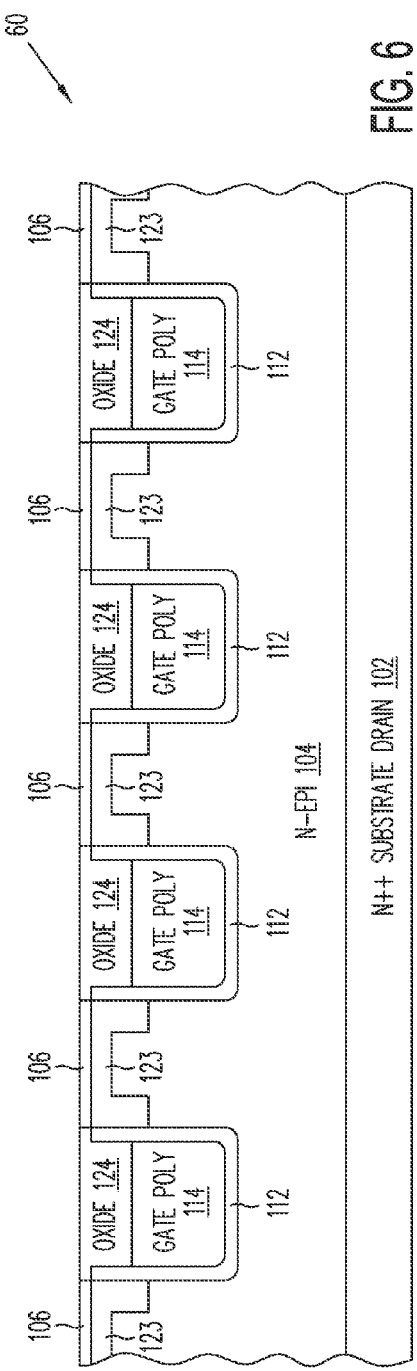
FIG. 6 illustrates processing subsequent to FIG. 5 after covering the recessed gate poly in the trenches with a trench fill layer.

FIG. 6 illustrates processing of the semiconductor wafer structure 60 subsequent to FIG. 5 after covering the recessed gate poly structures 114 in the trenches with a trench fill layer 124. With the patterned dielectric layers 106 and gate dielectric layers 112 in place, trench fill layers 124 are formed by filling each trench opening to cover the recessed gate poly structure 114 with a polished insulator material, such as by filling the trench opening with a blanket-deposited dielectric (such as high density plasma oxide), and then polishing, etching or otherwise planarizing the deposited dielectric to form the trench fill layer 124, alone or in combination with additional etching, stripping and/or cleaning processes. As will be appreciated, the top surface of the polished or planarized trench fill layer 124 may be substantially co-planar with the elevated surface region of the substrate n-epi layer 104 and/or the patterned dielectric layers 106 if they have not been removed by the polish process(s). In selected embodiments, the planarization process is controlled to retain all or part of the patterned dielectric layers 106 as charge trapping dielectrics for subsequent implantation steps. In other embodiments, the top surface of the trench fill layer 124 may not necessarily be co-planar with the patterned dielectric layers 106 if an etchback process is used to form the trench fill layer 124. However formed, the trench fill layers 124 block or protect the recessed gate poly structures 114 against subsequent p-type implantations.

Figure 7:
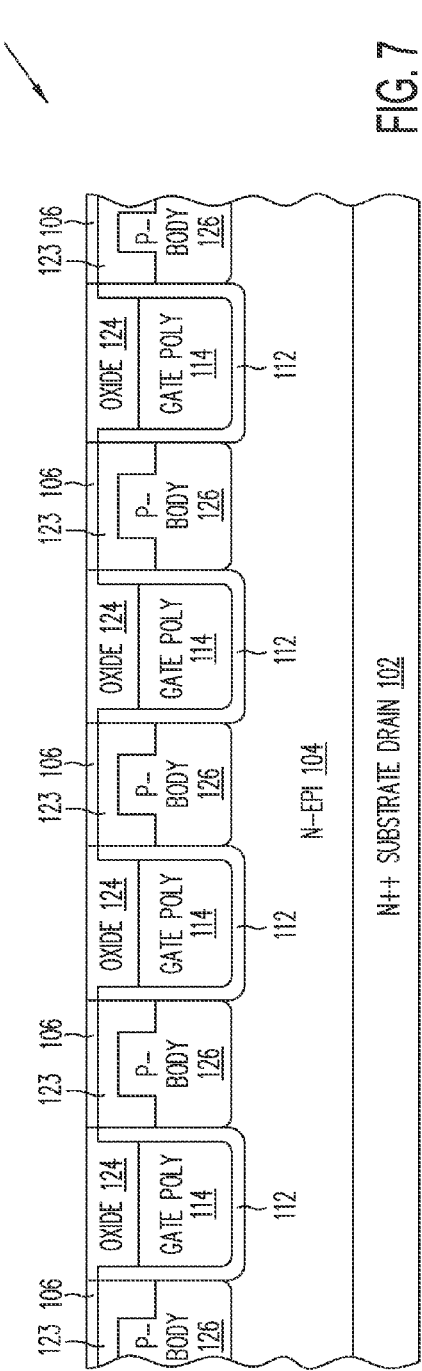
FIG. 7 illustrates processing subsequent to FIG. 6 after forming body regions between the trenches.

FIG. 7 illustrates processing of the semiconductor wafer structure 70 subsequent to FIG. 6 after forming body regions 126 between the trenches. In selected embodiments, the p-type body regions 126 may be formed by diffusing or implanting p-type impurities into the elevated surface region of the substrate n-epi layer 104 to a predetermined depth and doping level so as to form p-type body regions 126 that has substantially the same depth as the trench openings 110, but the bottom of the p-type body regions 126 can be higher or lower than the bottom of the recessed gate poly structure 114. For example, by implanting boron with a peak concentration of approximately 1E15-1E18 $cm^{-3}$ in the depth range of about from 0.2 to 1 micrometers and applying a subsequent heat drive or anneal step, p-type body regions 126 may be formed having a depth in the range of about 0.1 to 10 micrometers, more conveniently in the range of about 0.3 to 5 micrometers and preferably about 0.2 to 1 micrometers, but deeper or shallower p-type body regions can also be formed using different dopants and implant conditions. When forming the p-type body regions 126 with an implant process, the trench fill layers 124 block or protect the recessed gate poly structures 114 against the p-type implants, but the implanted p-type dopants penetrate through the self-aligned implant regions 123 and patterned oxide layers 106 so as to be located in an upper portion of the n-type epitaxial layer 104 between the trench gate electrodes.

FIG. 8 illustrates processing of the semiconductor wafer structure 80 subsequent to FIG. 7 after an additional unmasked implant/or chain implant with the p-type body 126) with a peak concentration of approximately 1E19 cm-3 or greater in the depth range of about from 0.1 to 0.5 micrometers forms implanted regions 128 adjacent to the self-aligned implant regions 123. As explained below, the implanted regions 128 will be used to form self-aligned body contact regions after a source recess etch is applied to the elevated surface region of the substrate n-epi layer 104. In selected embodiments, the implanted regions 128 may be formed by diffusing or implanting p-type impurities into the elevated surface region of the substrate n-epi layer 104 to a predetermined depth and doping level so as to form P+ implanted regions 128 that have substantially the same depth as the self-aligned N+ source regions 123 formed in the trench sidewalls adjacent to the recessed gate poly structures 114. Of course, while the bottom of P+ implanted regions 128 can be higher or lower than the bottom of trench sidewall N+ source regions 123. Also, the top of P+ implanted regions 128 and the top of the N+ source regions 123 can be at the same level or at different levels, either high or lower. For example, a p-type impurity (e.g., boron) may be implanted using implant dose, energy, and heat drive conditions (e.g., a peak concentration of approximately 1E19 $cm^{-3}$ or greater that is implanted to a depth of about 0.1-0.5 micrometers subsequently annealed) which are controlled so that the P+ implanted regions 128 have a higher dopant concentration than the p-type body regions 126, but a lower dose than the N+ self-aligned implant regions 123 formed in the trench sidewalk. In this way, the implanted p-type dopants used to form the P+ implanted regions 128 are able to penetrate through the patterned oxide layers 106 and the self-aligned implant regions 123 at the elevated surface region of the substrate n-epi layer 104 so as to be located in an upper portion of the n-type epitaxial layer 104 between the trench gate electrodes. However, by virtue of having a lower dose than the N+ self-aligned implant regions 123 formed in the trench sidewalls, the implanted p-type dopants are not able to overcome the self-aligned source regions 123 formed at the trench sidewalls.

FIG. 9 illustrates processing of the semiconductor wafer structure 90 subsequent to FIG. 8 after performing a source/body recess etch to form self-aligned N+ source regions 135-142 adjacent to the trench sidewalls and to form self-aligned P+ body contact regions 130-134 adjacent to the source regions 135-142. In selected embodiments, the source/body recess etch may be performed as reactive ion etch process or a chemical-mechanical polishing (CMP) process, alone or in combination with a brief oxide etch, to remove the patterned dielectric layers 106 and an upper region of an elevated substrate to thereby provide a substantially planarized semiconductor wafer structure 90, but other planarization techniques may also be used. As a result of the source/body recess etch, the portions of the self-aligned N-H implant regions 123 formed at the elevated substrate surface region of the n-epi layer 104 are removed. However, the portions of the self-aligned N+ source regions 123 formed at the trench sidewalls are not removed, thereby forming self-aligned N+ source regions 135-142 adjacent to the trench sidewalls. In addition, the source/body recess etch leaves intact all or part of the implanted P+ implanted regions 128 which now form self-aligned P+ body contact regions 130-134. By controlling the timing and application of the recess etch process, the top surfaces of the self-aligned N+ source regions 135-142 and P+ body contact regions 130-134 may be substantially planarized with one another, and may also be substantially co-planarized with the top of the recessed conductive gate structures 114. As will be appreciated, one or more silicide regions may be formed on the P-H body contact regions 130-134 and self-aligned N+ source regions 135-142 using any desired silicidation process, such as selectively forming and annealing one or more metal layer to form a silicide layer with the underlying semiconductor layers 130-142.

Figure 10:
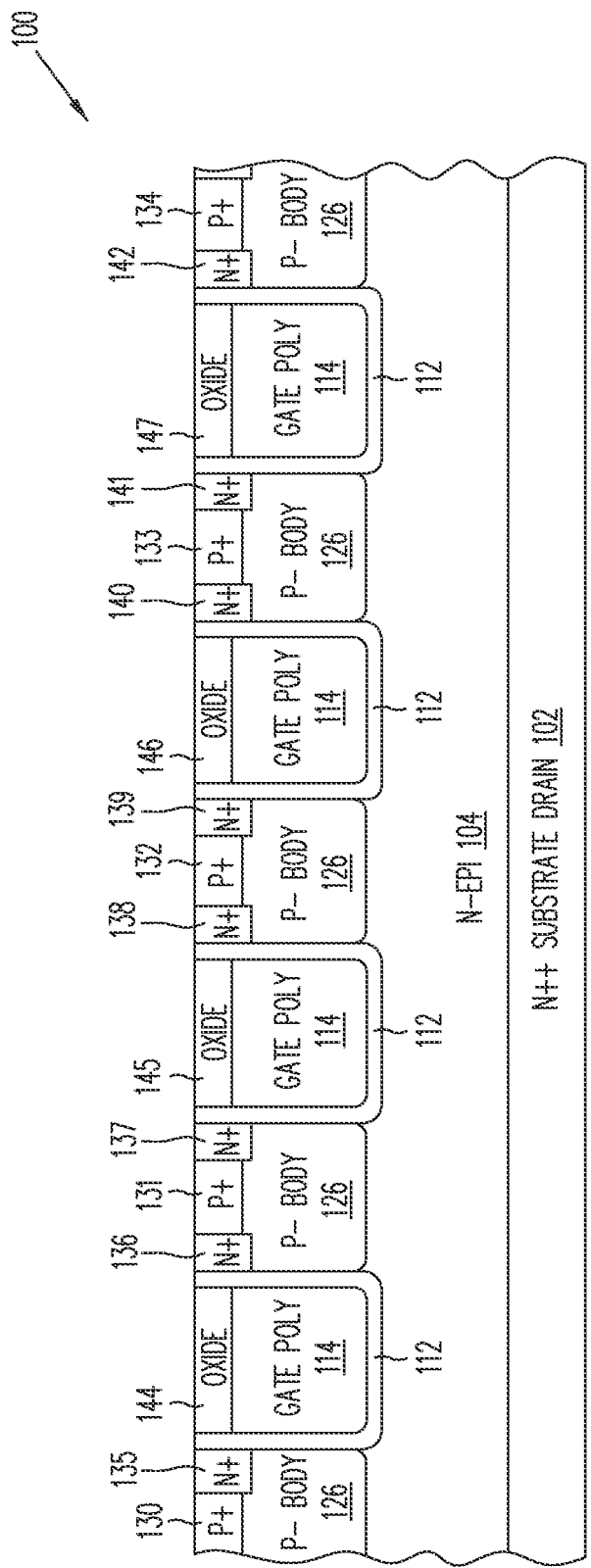
FIG. 10 illustrates processing subsequent to FIG. 9 after performing a recess etch of the trench fill layer.

If desired, the trench fill layers 124 may also be planarized as shown in FIG. 10 which illustrates processing of the semiconductor wafer structure 100 subsequent to FIG. 9 after performing a recess etch of the trench fill layer 124. While any desired recess etch process may be applied, in selected embodiments, the trench fill layers 124 are polished, etched or otherwise planarized to form the planarized trench fill layers 144-147 over the recessed conductive gate structures 114, alone or in combination with additional etching, stripping and/or cleaning processes. By controlling the timing, selectivity, and application of the recess etch process applied to form the planarized trench fill layers 144-147, the top surfaces of the self-aligned N+ source regions 135-142, P+ body contact regions 130-134, and planarized trench fill layers 144-147 may be substantially planarized with one another, and may also be substantially co-planarized with the top of the recessed conductive gate structures 114. As will be appreciated, one or more silicide regions may be formed on the P+ body contact regions 130-134 and self-aligned N+ source regions 135-142 using any desired silicidation process, such as selectively forming and annealing one or more metal layer to form a silicide layer with the underlying semiconductor layers 130-142.

Figure 11:
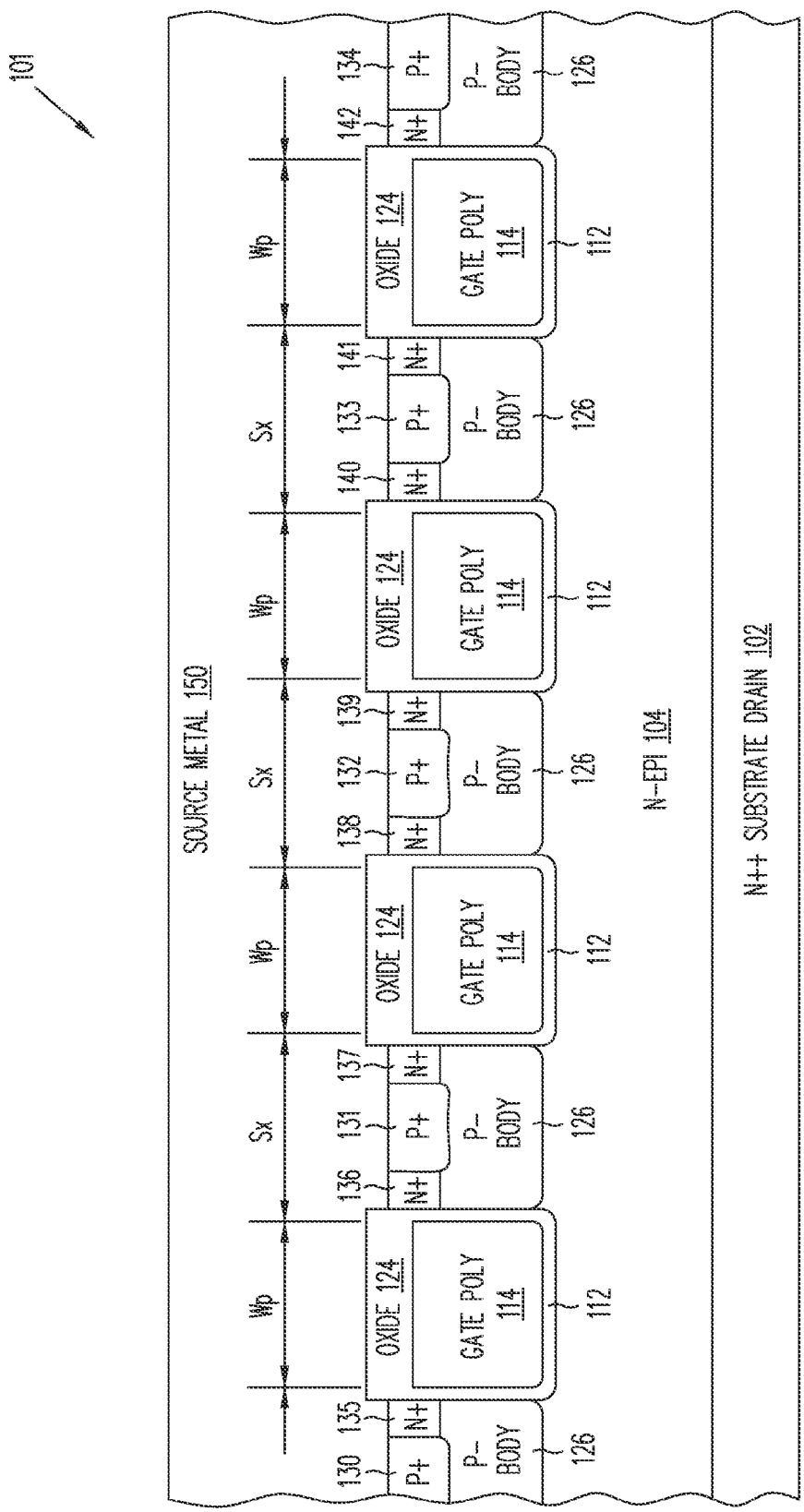
FIG. 11 illustrates processing subsequent to FIG. 9 after a conductive layer is formed over the semiconductor wafer structure to form source and body conductors.

FIG. 11 illustrates processing of the semiconductor wafer structure 101 subsequent to FIG. 9 after a conductive layer 150 is formed over the semiconductor wafer structure to form source and body conductors. At this stage, the conductive layer 150 may be formed by depositing one or more "metal 1" layers over the semiconductor wafer structure 100. In selected embodiments, the conductive layer 150 may be formed with any desired metal formation sequence, including but not limited to a depositing a metal layer to contact the self-aligned N+ source regions 135-142 and P+ body contact regions 130-134, where the trench fill layers 124 prevent the conductive layer 150 from contacting the conductive gate structures 114.

Figure 12:
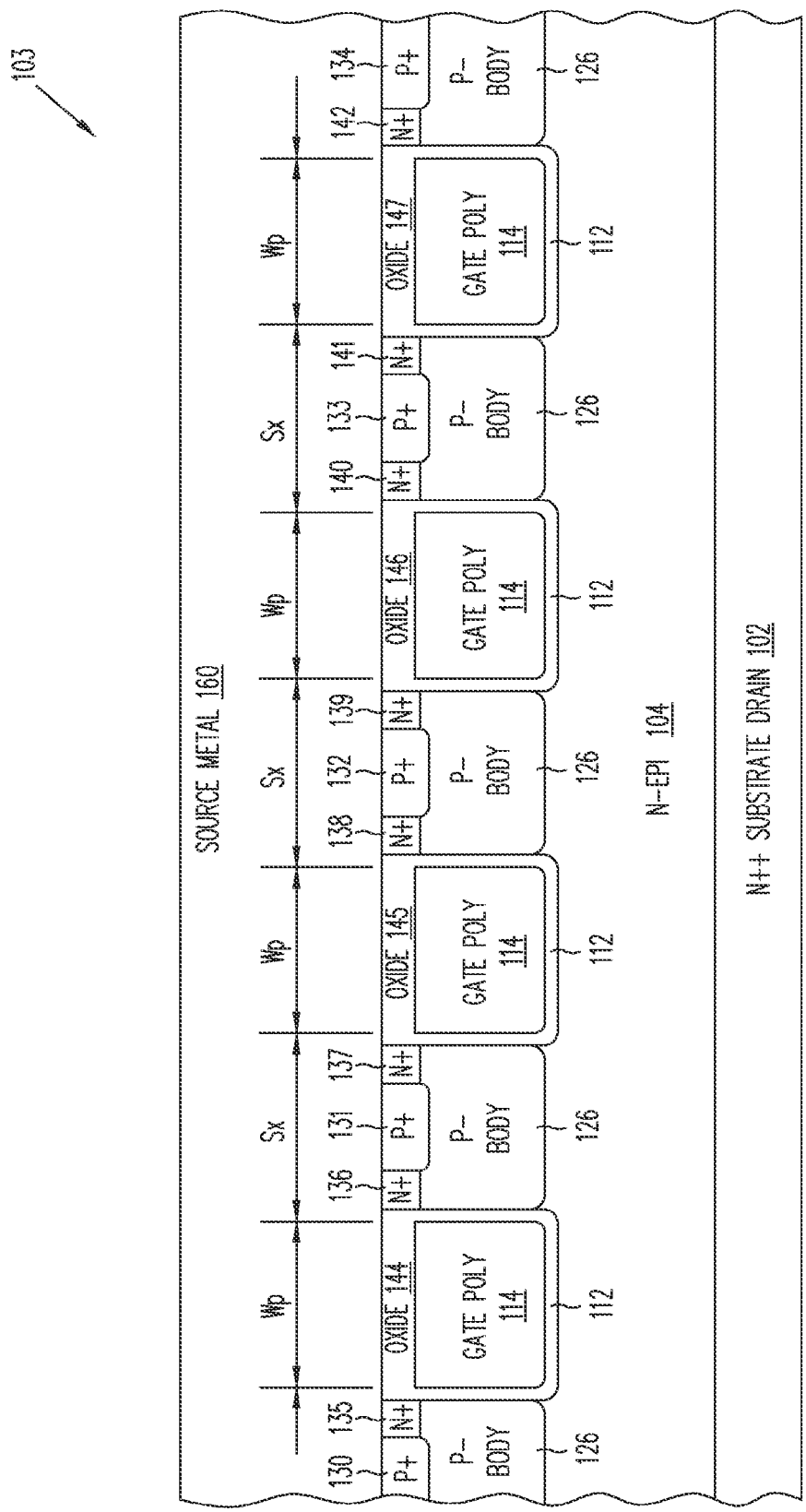
FIG. 12 illustrates processing subsequent to FIG. 10 after a conductive layer is formed over the planarized trench fill layers of the semiconductor wafer structure to form source and body conductors.

As will be appreciated, the source and body conductor may also be formed over the planarized semiconductor wafer structure 100 shown in FIG. 10. This is shown in FIG. 12 which illustrates processing of the semiconductor wafer structure 103 subsequent to FIG. 10 after a conductive layer 160 is formed over the planarized semiconductor wafer structure to form source and body conductors. As depicted, the conductive layer 160 may be formed by depositing one or more "metal 1" layers over the planarized semiconductor wafer structure 100 using any desired metal formation sequence, including but not limited to a depositing a metal layer to contact the self-aligned N+ source regions 135-142 and P+ body-contact regions 130-134, where the planarized trench fill layers 144-147 prevent the conductive layer 160 from contacting the conductive gate structures 114.

As a result of the fabrication sequences described herein, the semiconductor wafer structure 101 has formed therein a vertical channel MOSFET formed with a plurality of adjacent trench FETs. While the depicted examples show four adjacent trench FETs being formed, additional or fewer trench FET's may be formed. As formed, each trench FET includes, for example, p-type body regions (e.g., 126) with P+ body contact regions (e.g., 131, 132) and N+ self-aligned source regions (e.g., 137, 138) formed therein. In addition, conductive gates 114 are separated from the p-type body regions (e.g., 126) and self-aligned N+ source regions 135-142 by gate dielectric 112. Finally, the self-aligned N+ source regions (e.g., 137, 138) have source and body conductor contact 150 which acts as one of the principal current carrying contacts of vertical channel MOSFET. By using first and second angled implants 116, 120, the self-aligned source regions 135-142 are formed without using N+ photo block masks, thereby avoiding the associated minimum design rule width limitations. As a result, the device pitches (e.g., lateral spacing between the centers of adjacent trenches) are reduced so that device density is increased. In FIGS. 11-12, the width of the conductive gate poly structures 114 is indicated as Wp, and the lateral spacing between conductive gate poly structures 114 is indicated as Sx. In contrast to the lateral spacing between conductive gate poly structures 14 shown in FIG. 1, it can be seen that the use of self-aligned source regions achieves tighter gate trench widths and increased device density. Of course, it will be appreciated that the polarity types of the various regions mentioned herein may be changed or reversed. For example, the P+ and P-Body regions may instead be n-type regions that are formed as N+ and N-Body regions. In addition, the N+ and N-Epi regions may instead be p-type regions that are formed as P+ and P-Epi regions.

Figure 13:
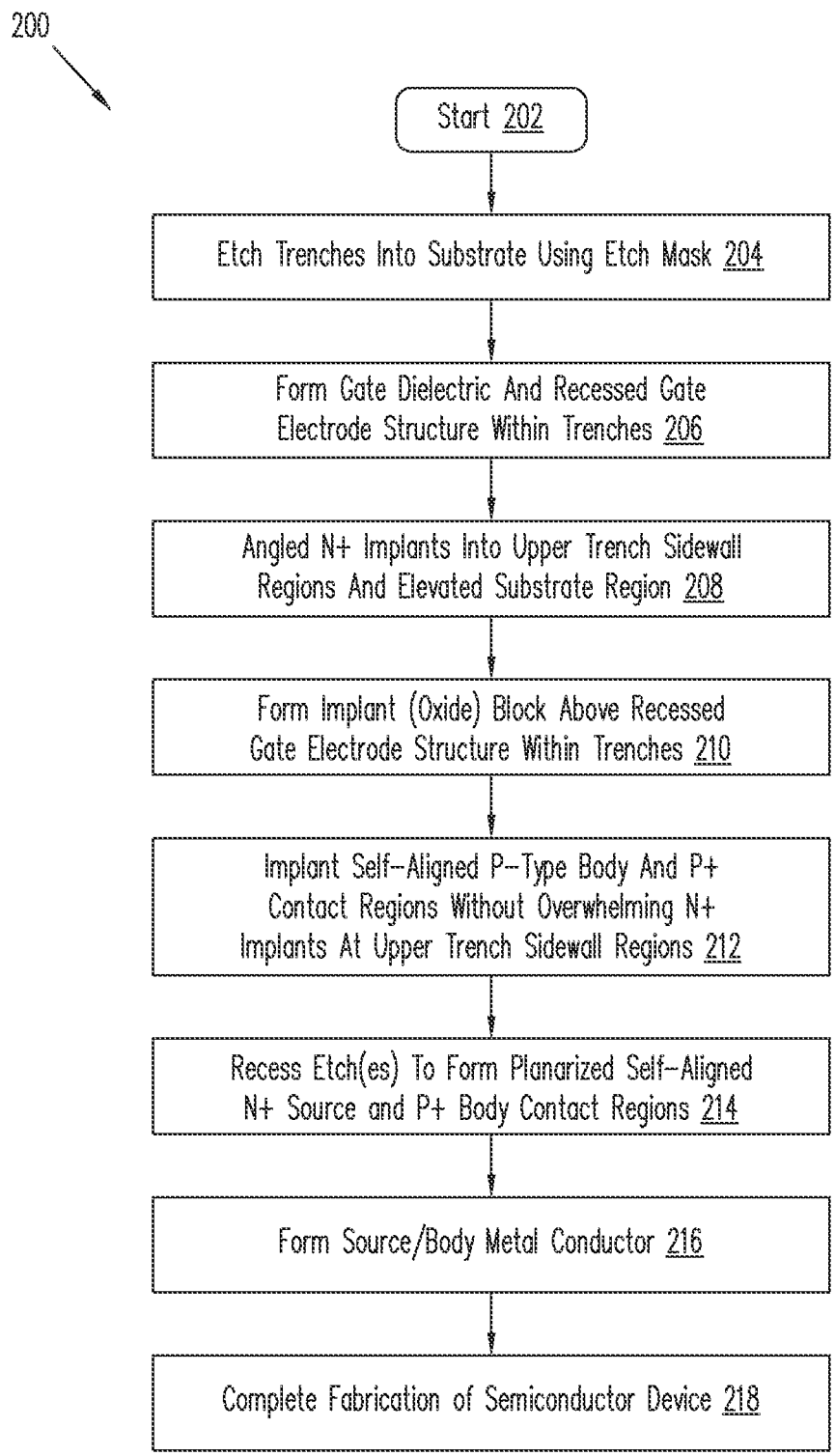
FIG. 13 is a simplified schematic flow chart illustrating various methods for fabricating devices in accordance with selected embodiments of the invention.

To further illustrated selected embodiments of the present invention, reference is now made to FIG. 13 which is a simplified schematic flow chart illustrating various methods for fabricating devices in accordance with selected embodiments of the invention. In describing the fabrication methodology 200, the description is intended merely to facilitate understanding of various exemplary embodiments and not by way of limitation. Unless otherwise indicated, subsequent steps may be provided in any desired order. Since the steps illustrated in FIG. 13 and described below are provided by way of example only, it will be appreciated that alternative embodiments of fabrication method 200 may include additional steps, omit certain steps, substitute or alter certain steps, or perform certain steps in an order different than that illustrated in FIG. 13.

Once the fabrication methodology starts (step 201), one or more trenches are etched into a semiconductor substrate using a patterned etch mask at step 204. In an example embodiment, a semiconductor substrate structure may be provided as a bulk silicon wafer or any other substrate on which patterned oxide capping and etch mask layers are formed to define a plurality of trench etch openings having predetermined widths which enable trench openings to be etched into the semiconductor substrate using one or more anisotropic etching processes to remove trench portions of semiconductor substrate. As will be appreciated, the directional nature of the anisotropic etching process will result in trench sidewalk that are substantially vertical and are closely laterally aligned with the inner edges of etch mask openings.

After etching the trench openings into the semiconductor substrate, a gate dielectric layer and recessed gate electrode structure are formed within each trench at step 206. In an example embodiment, the gate dielectric layer may be grown or deposited onto the inner surfaces of trenches formed in the semiconductor substrate, such as by growing a relatively thin layer of silicon oxide to a predetermined thickness (e.g., 10 to 50 nanometers). Subsequently, the recessed gate electrode structure may be formed on the gate dielectric and at the bottom of each trench by blanket depositing a polysilicon layer which is then etched back with a timed reactive ion etch process so that the top of the recessed gate electrode structure is below the top of the elevated semiconductor substrate. Of course, other processing steps may be used to form the recessed gate electrode structure, including using one or more sacrificial materials and/or plug materials in combination with selected etch processes to form the recessed gate electrode.

At step 208, N+ implant regions are formed in the upper trench sidewall regions and elevated semiconductor substrate region by using angled N+ implants. In an example embodiment, a first implant of arsenic is performed at an angle of 45 degrees at a predetermined dose and implant energy. In addition, a second implant of arsenic is performed at a complementary angle of 45 degrees at the predetermined dose and implant energy. While the implantation angle may be adjusted between the first and second implants, the substrate does not have to be removed from the implanter, but may be instead be rotated 90 degrees about the direction of implantation to present a complementary angle for the second implant. As will be appreciated, the first and second implants form N+ implant regions in the upper trench sidewall regions and elevated semiconductor substrate regions, but also implant the recessed gate electrode structure.

At step 210, implant blocking layers are formed above the recessed gate electrode structure. In an example embodiment, a oxide blocking layers are formed by depositing a layer of oxide to cover the recessed gate electrode structures in the trenches, and then polishing or etching the oxide layer until the oxide blocking layers are substantially coplanar with the top of the elevated semiconductor substrate.

At step 212, self-aligned p-type body and P+ contact implant regions are formed in the elevated semiconductor substrate region by using a plurality of vertical implant steps. In an example embodiment, a first p-type implant is performed at a first predetermined dose and implant energy to form the p-type body regions between the gate electrode trenches without also counter-doping the recessed gate electrode structure due to the blocking action of the implant blocking layers. In addition, a second implant is performed at a second predetermined dose and implant energy to form the P+ body contact regions to a depth that is substantially equal to the depth of the N+ implant regions formed in the upper trench sidewalls without also counter-doping the recessed gate electrode structure due to the blocking action of the implant blocking layers. However, the dosage of the second P+ implant is controlled to be lower than the dosage of the N+ implant regions so that the second implant does not counter-dope the N+ implant regions formed in the upper trench sidewalls.

At step 214, one or more recess etch processes are applied to remove the top portion of the elevated semiconductor substrate, thereby forming planarized self-aligned N+ source and P+ body contact regions adjacent to the recessed gate electrode structures. In an example embodiment, one or more CMP or RIE recess etch processes may be applied to remove the N+ implant regions formed in the top portion of the elevated semiconductor substrate. In addition, the oxide blocking layers formed over the recessed gate electrode structures may also be polished or etched until substantially coplanar with the self-aligned N+ source and P+ body contact regions.

At step 216, one or more source/body metal conductor layers are formed to connect the self-aligned N+ source and P+ body contact regions. And at step 218, additional fabrication steps are performed to fabricate and connect the vertical trench FET structures described herein, such as forming a contact to the bottom drain region 102, recessed gate electrode 114, and source/body contacts. In addition, thermal treatments for the implanted regions are applied at some point in the fabrication sequence to activate the implanted regions and otherwise repair implantation damage. In addition, other circuit features may be formed on the wafer structure, such as transistor devices, using one or more of sacrificial oxide formation, stripping, isolation region formation, well region formation, gate dielectric and electrode formation, extension implant, halo implant, spacer formation, source/drain implant, heat drive or anneal steps, and polishing steps, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

By now it should be appreciated that there is provided herein a high density vertical field effect transistor and associated method for fabricating same. In the disclosed fabrication method, a recessed conductive gate electrode structure is formed in a trench opening of a semiconductor substrate structure so that the top surface of the recessed conductive gate structure is below an elevated surface region of the semiconductor substrate structure. In selected embodiments, the recessed conductive gate electrode structure is formed by providing a semiconductor substrate structure having an elevated surface region, selectively removing a portion of the semiconductor substrate structure in a first region to form a trench opening defined by first and second opposite trench sidewalls, and then forming a recessed conductive gate electrode structure and gate dielectric in the trench opening, the recessed conductive gate structure having a top surface which is below the elevated surface region of the semiconductor substrate structure. With the recessed gate electrode in place, dopants of a first conductivity type are implanted using one or more angled implants into an upper region of an elevated substrate and trench sidewalls located above the recessed conductive gate electrode structure without using an implant mask to form surface implant regions and self-aligned source regions adjacent to the recessed conductive gate electrode structure. The dopants may be implanted using the angled implant(s) to form first surface implant regions in the elevated surface region of the semiconductor substrate structure and first, sidewall implant regions in the first, and second opposite trench sidewalls that extend to a first depth that is below the top surface of the recessed conductive gate electrode structure. In addition, an implant block layer may be formed over the recessed conductive gate electrode structure in the trench opening by depositing an oxide layer to fill the portion of the trench opening above the recessed conductive gate electrode structure, and then planarizing the oxide layer to form an oxide implant block layer over the recessed conductive gate electrode structure in the trench opening. After forming the implant block layer, dopants of a second opposite conductivity type are implanted into the semiconductor substrate structure without using an implant mask to form self-aligned body contact regions adjacent to the self-aligned source regions. In selected embodiments, the dopants of the second opposite conductivity type are implanted to form self-aligned body contact regions to a depth that is substantially equal to the depth of the self-aligned source regions adjacent to the recessed conductive gate electrode structure. In addition, dopants of the second opposite conductivity type may be implanted into the semiconductor substrate structure to form body regions to a depth that is substantially equal to the depth of the trench opening. After the implantation steps, a recess etch, such as a chemical mechanical polish or reactive ion etch process, is applied to the elevated surface region of the semiconductor substrate structure to remove the surface implant region while retaining the self-aligned source regions adjacent to the recessed conductive gate electrode structure and the self-aligned body contact regions adjacent to the self-aligned source regions. The recess etch process(es) may also be applied to the implant block layer to form a recessed implant block layer that is substantially coplanar with the self-aligned body contact regions and self-aligned source regions. After the recess etch(es), a conductive metal conductor layer is formed to contact the self-aligned body contact regions and self-aligned source regions.

In another form, there is provided a method for fabricating a trench field effect transistor. In the disclosed methodology, a semiconductor substrate structure is provided that has an elevated surface region. In the semiconductor substrate structure, trench openings are formed with each trench opening defined by first and second opposite trench sidewalls. The trench openings may be formed by patterning a nitride layer and oxide layer on the elevated surface region of the semiconductor substrate to define a plurality of etch openings over the intended trench openings, followed by selectively removing portions of the semiconductor substrate structure exposed by the plurality of etch openings to form the plurality of trench openings in the semiconductor substrate structure. In addition, recessed conductive gate electrode structure is formed in each trench opening to have a top surface which is below the elevated surface region of the semiconductor substrate structure. In selected embodiments, the recessed conductive gate electrode structure is formed by first forming a gate dielectric layer in the plurality of trench openings, followed by depositing a conformal layer of polysilicon over the gate dielectric layer in the plurality of trench openings and then applying a reactive ion etch to etch the conformal layer of polysilicon to have a top surface which is below an elevated surface region of the semiconductor substrate structure. After stripping the patterned nitride layer, angled implants are used to implant dopants of a first conductivity type to form first surface implant regions in the elevated surface region of the semiconductor substrate structure and first sidewall implant regions in the first and second opposite trench sidewalls of each trench opening that extend to a first depth that is below the top surface of the recessed conductive gate electrode structure. An implant block layer is formed over the recessed conductive gate electrode structure in each trench opening, such as by depositing an oxide layer to fill the plurality of trench openings and then planarizing the oxide layer to form an oxide implant block layer over each recessed conductive gate electrode structure. Subsequently, dopants of a second opposite conductivity type are implanted using an implant dose that is lower than the first surface implant regions and first sidewall implant regions to form second implant regions between each trench opening in the semiconductor substrate structure to a second depth that penetrates below the elevated surface region of the semiconductor substrate and that is substantially equal to the depth of the first sidewall implant region. Dopants of the second opposite conductivity type are also implanted to form body regions between the trench openings to a depth that is substantially equal to the depth of the plurality of trench openings, where the body regions have an implant dose that is lower than the first surface implant regions and first sidewall implant regions. After implanting the second implant regions, the elevated surface region of the semiconductor substrate structure is recessed (e.g., with a CMP or reactive ion etch process) to remove the first surface implant regions and part of the second implant regions while leaving at least part of the first sidewall implant regions in the first and second opposite trench sidewalls and a part of the second implant regions in the recessed semiconductor substrate structure. In addition, a recess etch may be applied to the implant block layer to form a recessed implant block layer that is substantially coplanar with the first sidewall implant regions remaining after recessing the elevated surface region.

In yet other embodiments, there is disclosed a method of forming a trench transistor. Initially, a trench is formed in a substrate having a surface such that the trench has a first upper sidewall and a second upper sidewall. Subsequently, a recessed gate structure is formed in the trench to have a top surface which is below the surface of the substrate to thereby expose the first and second upper sidewalls. After forming the recessed gate structure, a first dose of dopants is implanted such that a portion of the first dose is implanted through the first upper sidewall to form first self-aligned source regions, and a further portion of the first dose is implanted through the surface to form first surface implant regions. After changing an orientation of the substrate relative to an axis of implantation by a predetermined number of degrees, a second dose of dopants is implanted such that a portion of the second dose is implanted through the second upper sidewall to form second self-aligned source regions, and a further portion of the second dose is implanted through the surface to form second surface implant regions. In addition, an oxide fill layer is formed over the recessed gate structure in the trench, and a third dose of dopants is implanted into the substrate without using an implant mask to form self-aligned body contact regions adjacent to the first and second self-aligned source regions. Subsequently, a recess etch is applied to the substrate to remove the first and second surface implant region while retaining portions of the first and second self-aligned source regions adjacent to the recessed gate structure and the self-aligned body contact regions. In addition, the oxide layer may be etched or polished to form a recessed oxide fill layer that is substantially coplanar with the retained portions of the first and second self-aligned source regions.

Although the described exemplary embodiments disclosed herein are directed to high power current switch devices and methods for making same, the present invention is not necessarily limited to the example embodiments which illustrate inventive aspects of the present invention that are applicable to a wide variety of transistor fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various devices illustrated herein are described with reference to NMOS vertical trench FET devices, this is merely for convenience of explanation and not intended to be limiting and persons of skill in the art will understand that the principles taught herein apply to devices formed with different types of devices. In addition, different dopant types and concentrations may be used than disclosed herein. Moreover, the dimensions of the described layers and regions may deviate from the disclosed dimension values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that, they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for fabricating a vertical field effect transistor, comprising:
    forming a recessed conductive gate electrode structure in a trench opening of a semiconductor substrate structure, the recessed conductive gate structure having a top surface which is below an elevated surface region of the semiconductor substrate structure;
    forming an implant block layer over the recessed conductive gate electrode structure in the trench opening by depositing an oxide layer to fill the portion of the trench opening above the recessed conductive gate electrode structure and planarizing the oxide layer to form an oxide implant block layer over the recessed conductive gate electrode structure in the trench opening;
    implanting dopants of a first conductivity type using one or more angled implants into an upper region of an elevated substrate and trench sidewalls located above the recessed conductive gate electrode structure to form surface implant regions and self-aligned source regions adjacent to the recessed conductive gate electrode structure;
    implanting dopants of a second opposite conductivity type into the semiconductor substrate structure to form self-aligned body contact regions adjacent to the self-aligned source regions;
    applying a recess etch to the elevated surface region of the semiconductor substrate structure to remove the surface implant region while retaining the self-aligned source regions adjacent to the recessed conductive gate electrode structure and the self-aligned body contact regions adjacent to the self-aligned source regions; and
    applying a recess etch to the implant block layer after applying the recess etch to the elevated surface region of the semiconductor substrate structure, thereby forming a recessed implant block layer that is substantially coplanar with the self-aligned body contact regions and self-aligned source regions.

2. The method of claim 1, where implanting dopants of the first conductivity type comprises using one or more angled implants without using an implant mask to form first surface implant regions in the elevated surface region of the semiconductor substrate structure and first sidewall implant regions in the first and second opposite trench sidewalls that extend to a first depth that is below the top surface of the recessed conductive gate electrode structure.

3. The method of claim 1, where implanting dopants of the second opposite conductivity type comprises implanting dopants of a second opposite conductivity type into the semiconductor substrate structure without using an implant mask to form self-aligned body contact regions adjacent to the self-aligned source regions.

4. The method of claim 1, further comprising implanting dopants of the second opposite conductivity type into the semiconductor substrate structure to form body regions to a depth that is substantially equal to the depth of the trench opening.

5. The method of claim 1, where implanting dopants of the second opposite conductivity type forms self-aligned body contact regions to a depth that is substantially equal to the depth of the self-aligned source regions adjacent to the recessed conductive gate electrode structure.

6. The method of claim 1, where applying the recess etch to the elevated surface region of the semiconductor substrate structure comprises applying a chemical mechanical polish or reactive ion etch process to the elevated surface region of the semiconductor substrate structure.

7. The method of claim 1, further comprising forming a conductive metal conductor layer to electrically contact the self-aligned body contact regions and self-aligned source regions, either directly or indirectly through one or more silicide layers.

8. A method for fabricating a trench field effect transistor, comprising:
    providing a semiconductor substrate structure having an elevated surface region;
    forming a plurality of trench openings in the semiconductor substrate structure, where each trench opening is defined by first and second opposite trench sidewalls;
    forming a recessed conductive gate electrode structure in each trench opening, the recessed conductive gate structure having a top surface which is below the elevated surface region of the semiconductor substrate structure;
    forming an implant block layer over the recessed conductive gate electrode structure in each trench opening by depositing an oxide layer to fill the plurality of trench openings above the recessed conductive gate electrode structures and planarizing the oxide layer to form an oxide implant block layer over each recessed conductive gate electrode structure;
    implanting dopants of a first conductivity type using one or more angled implants to form first surface implant regions in the elevated surface region of the semiconductor substrate structure and first sidewall implant regions in the first and second opposite trench sidewalls of each trench opening that extend to a first depth that is below the top surface of the recessed conductive gate electrode structure;

implanting dopants of a second opposite conductivity type to form second implant regions between each trench opening in the semiconductor substrate structure to a second depth that penetrates below the elevated surface region of the semiconductor substrate;

recessing the elevated surface region of the semiconductor substrate structure to remove the first surface implant regions and part of the second implant regions while leaving at least part of the first sidewall implant regions in the first and second opposite trench sidewalls and a part of the second implant regions in the recessed semiconductor substrate structure; and applying a recess etch to the implant block layer in each trench opening, thereby forming a recessed implant block layer that is substantially coplanar with the first sidewall implant regions remaining after recessing the elevated surface region.

9. The method of claim 8, where implanting dopants of the first conductivity type comprises using one or more angled implants which impinge at an incident angle of between about 30-45 degrees to the elevated surface region of the substrate structure.

10. The method of claim 8, where forming the recessed conductive gate electrode structure comprises:

forming a gate dielectric layer in the plurality of trench openings;

depositing a conformal layer of polysilicon over the gate dielectric layer in the plurality of trench openings;

applying a reactive ion etch to etch the conformal layer of polysilicon to have a top surface which is below an elevated surface region of the semiconductor substrate structure.

11. The method of claim 8, where forming the plurality of trench openings comprises:

forming patterned nitride layer and oxide layer on the elevated surface region of the semiconductor substrate defining a plurality of etch openings over the intended trench openings;

selectively removing portions of the semiconductor substrate structure exposed by the plurality of etch openings to form the plurality of trench openings in the semiconductor substrate structure; and stripping the patterned nitride layer prior to implanting dopants of the first conductivity type.

12. The method of claim 8, further comprising implanting dopants of the second opposite conductivity type into the semiconductor substrate structure to form body regions between the plurality of trench openings to a depth that is substantially equal to the depth of the plurality of trench openings, where the body regions have an implant dose that is lower than the first surface implant regions and first sidewall implant regions.

13. The method of claim 8, where implanting dopants of the second opposite conductivity type comprises implanting dopants of the second opposite conductivity type using an implant dose that is lower than the first surface implant regions and first sidewall implant regions to form self-aligned body contact regions to a depth that is substantially equal to the depth of the first sidewall implant regions.

14. The method of claim 8, where recessing the elevated surface region comprises applying a chemical mechanical polish or reactive ion etch process to the elevated surface region of the semiconductor substrate structure.

15. A method of forming a trench transistor, comprising:
a) forming a trench in a substrate, the substrate having a surface and the trench having a first upper sidewall and a second upper sidewall;
b) forming a recessed gate structure in the trench, the recessed gate structure having a top surface which is below the surface of the substrate to thereby expose the first and second upper sidewalls;
c) forming an implant block layer over the recessed gate structure in the trench by depositing an oxide layer to fill the trench above the recessed gate structure and planarizing the oxide layer to form an oxide implant block layer over the recessed gate structure;
d) implanting a first dose of dopants such that a portion of the first dose is implanted through the first upper sidewall to form first self-aligned source regions, and a further portion of the first dose is implanted through the surface to form a first surface implant region;
e) changing an orientation of the substrate relative to an axis of implantation by a predetermined number of degrees;
f) implanting a second dose of dopants such that a portion of the second dose is implanted through the second upper sidewall to form second self-aligned source regions, and a further portion of the second dose is implanted through the surface to form a second surface implant region;
g) implanting a third dose of dopants into the substrate without using an implant mask to form a self-aligned body contact regions adjacent to the first and second self-aligned source regions;
h) applying a recess etch to the substrate to remove the first and second surface implant region while retaining portions of the first and second self-aligned source regions adjacent to the recessed gate structure and the self-aligned body contact region; and
i) applying a recess etch to the implant block layer in the trench, thereby forming a recessed implant block layer that is substantially coplanar with the first and second self-aligned source regions remaining after applying the recess etch to the substrate.

16. The method of claim 15, further comprising forming a conductive metal conductor layer to electrically contact the portions of the first and second self-aligned source regions and the self-aligned body contact regions, either directly or indirectly through one or more silicide layers.

* * * * *

UNITED STATES PATENT AND TRADEMARK OFFICE
CERTIFICATE OF CORRECTION

| | | |
|---|---|---|
| PATENT NO. | : 8,895,394 B2 | Page 1 of 1 |
| APPLICATION NO. | : 13/528375 | |
| DATED | : November 25, 2014 | |
| INVENTOR(S) | : Ganming Qin et al. | |

It is certified that error appears in the above-identified patent and that said Letters Patent is hereby corrected as shown below:

In the Claims

Claim 15, Column 18, line 40, should read "body contact region adjacent to the first and second".

Signed and Sealed this
Third Day of March, 2015

Michelle K. Lee
*Deputy Director of the United States Patent and Trademark Office*